United States Patent
Yang et al.

(10) Patent No.: US 12,225,803 B2
(45) Date of Patent: Feb. 11, 2025

(54) DISPLAY APPARATUSES, DISPLAY PANELS AND PREPARATION METHODS OF DISPLAY PANEL

(71) Applicants: Chengdu BOE Optoelectronics Technology Co., Ltd., Chengdu (CN); BOE Technology Group Co., Ltd., Beijing (CN)

(72) Inventors: Ke Yang, Beijing (CN); Huaisen Ren, Beijing (CN); Zubin Lv, Beijing (CN); Zhendong Li, Beijing (CN); Tao Gao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 580 days.

(21) Appl. No.: 17/359,470

(22) Filed: Jun. 25, 2021

(65) Prior Publication Data

US 2022/0059601 A1     Feb. 24, 2022

(30) Foreign Application Priority Data

Aug. 24, 2020   (CN) .......................... 202010859306.8

(51) Int. Cl.
*H10K 59/60*     (2023.01)
*H01L 27/146*    (2006.01)
*G06V 40/13*     (2022.01)

(52) U.S. Cl.
CPC ....... *H10K 59/60* (2023.02); *H01L 27/14603* (2013.01); *H01L 27/14643* (2013.01);
(Continued)

(58) Field of Classification Search
CPC ......... H01L 27/14643; H01L 27/14603; H01L 27/14683; H01L 27/14678; G06F 1/1686; H10K 59/60; H10K 71/00; G06V 40/1318

See application file for complete search history.

(56) References Cited

U.S. PATENT DOCUMENTS

2018/0173349 A1 *  6/2018  Cho et al. ............. G06F 3/0412
2018/0239943 A1 *  8/2018  Xu ..................... G06V 40/1318
(Continued)

FOREIGN PATENT DOCUMENTS

CN        102324445 A  *  1/2012   ............. Y02P 70/50
CN        107579101 A     1/2018
(Continued)

OTHER PUBLICATIONS

CN202010859306.8 first office action.

*Primary Examiner* — Ratisha Mehta
*Assistant Examiner* — Brad A Knudson
(74) *Attorney, Agent, or Firm* — IPro, PLLC

(57) ABSTRACT

The present disclosure provides a display panel including: a substrate and a cover plate, disposed oppositely; a plurality of drive transistors, a plurality of reading transistors and a plurality of Schottky photodiodes, which are disposed on the substrate and located at a side of the substrate facing toward the cover plate; each of the Schottky photodiodes includes a photosensitive active layer and an interdigital electrode layer, the interdigital electrode layer is disposed on the photosensitive active layer and includes at least one first interdigital electrode and at least one second interdigital electrode spaced apart, each of the at least one first interdigital electrode is connected to a corresponding one of the reading transistors, and each of the at least one second interdigital electrode is connected to a bias signal terminal;

(Continued)

a plurality of light-emitting units, disposed between the substrate and the cover plate and connected to the drive transistors one-to-one.

19 Claims, 4 Drawing Sheets

(52) U.S. Cl.
CPC .. *H01L 27/14678* (2013.01); *H01L 27/14683* (2013.01); *G06V 40/1318* (2022.01)

(56) References Cited

U.S. PATENT DOCUMENTS

| | | |
|---|---|---|
| 2019/0067385 A1 | 2/2019 | Xu et al. |
| 2020/0020736 A1 | 1/2020 | Liang et al. |
| 2020/0160023 A1 | 5/2020 | Hu et al. |

FOREIGN PATENT DOCUMENTS

| | | | | |
|---|---|---|---|---|
| CN | 108153027 A | | 6/2018 | |
| CN | 108962928 A | | 12/2018 | |
| JP | 2020092080 A | * | 6/2020 | ............. G06F 21/32 |
| WO | WO-2018129970 A1 | * | 7/2018 | ............. G06F 3/041 |

\* cited by examiner

DISPLAY APPARATUSES, DISPLAY PANELS AND PREPARATION METHODS OF DISPLAY PANEL

CROSS REFERENCE TO RELATED APPLICATIONS

This application claims priority to Chinese Patent Application No. 2020108593068 entitled "DISPLAY APPARATUSES, DISPLAY PANELS AND PREPARATION METHODS OF DISPLAY PANEL" filed on Aug. 24, 2020, the entire content of which is incorporated herein by reference.

TECHNICAL FIELD

The present disclosure relates to the field of display technologies and in particular to display apparatuses, display panels and preparation methods of display panels.

BACKGROUND

Fingerprint recognition mainly includes capacitive fingerprint recognition, optical fingerprint recognition and ultrasonic fingerprint recognition. The capacitive fingerprint recognition structure cannot effectively realize full-screen fingerprint recognition. The ultrasonic fingerprint recognition structure is complex and immature in technologies, resulting in low feasibility in the full-screen fingerprint recognition applications currently. The optical fingerprint recognition structure is simple and high in applicability.

SUMMARY

According to an aspect of the present disclosure, there is provided a display panel, including a substrate and a cover plate, disposed oppositely; a plurality of drive transistors, disposed on the substrate and located at a side of the substrate facing toward the cover plate; a plurality of reading transistors, disposed on the substrate and located at a side of the substrate facing toward the cover plate; a plurality of Schottky photodiodes, disposed on the substrate and located at a side of the substrate facing toward the cover plate and each of the Schottky photodiodes including: a photosensitive active layer; and an interdigital electrode layer, wherein the interdigital electrode layer is disposed on the photosensitive active layer and includes at least one first interdigital electrode and at least one second interdigital electrode spaced apart, each of the at least one first interdigital electrode is connected to a corresponding one of the reading transistors, and each of the at least one second interdigital electrode is connected to a bias signal terminal; and a plurality of light-emitting units, disposed between the substrate and the cover plate and connected to the drive transistors one-to-one.

Further, a plurality of recesses are disposed at a surface of the photosensitive active layer away from the substrate, and the interdigital electrode layer fills the plurality of recesses.

Further, a depth of each of the plurality of recesses is smaller than or equal to a thickness of the photosensitive active layer.

Further, the at least one first interdigital electrode includes a plurality of first interdigital electrodes which are parallel-disposed at intervals; the at least one second interdigital electrode includes a plurality of second interdigital electrodes which are parallel-disposed at intervals; any one of the first interdigital electrodes is parallel to any one of the second interdigital electrodes; the first interdigital electrodes and the second interdigital electrodes are alternately arranged, a distance between any adjacent first interdigital electrode and second interdigital electrode is 2 μm-15 μm, and widths of the first interdigital electrodes and the second interdigital electrodes are 2 μm-10 μm.

Further, each of the drive transistors includes: a first active layer, disposed on the substrate and arranged with the photosensitive active layer on a same layer.

Further, each of the drive transistors further includes: a gate insulation layer, covering the first active layer and the photosensitive active layer; a first gate layer, disposed at a side of the gate insulation layer away from the substrate; an inter-layer insulation layer, covering the first gate layer and the gate insulation layer, wherein a plurality of first vias exposing the first active layer and a plurality of second vias exposing the photosensitive active layer are formed in the inter-layer insulation layer and the gate insulation layer; and a first source/drain layer, covering the inter-layer insulation layer and being in contact with the first active layer through the first vias; wherein the interdigital electrode layer covers the inter-layer insulation layer and is in contact with the photosensitive active layer through the second vias.

Further, each of the reading transistors includes: a second active layer, disposed on the substrate and arranged on a same layer as the first active layer, wherein the gate insulation layer covers the second active layer; a second gate layer, disposed at a side of the gate insulation layer away from the substrate, and arranged on a same layer as the first gate layer, wherein the inter-layer insulation layer is disposed at a side of the second gate layer away from the substrate, and a plurality of third vias exposing the second active layer are formed in the inter-layer insulation layer and the gate insulation layer; and a second source/drain layer, covering the inter-layer insulation layer, connected with the at least one first interdigital electrode and being in contact with the second active layer through the third vias.

Further, each of the drive transistors includes: a first active layer, disposed on the substrate; a gate insulation layer, covering the first active layer and the substrate; a first gate layer, disposed at a side of the gate insulation layer away from the substrate; and an inter-layer insulation layer, covering the first gate layer and the gate insulation layer; wherein the photosensitive active layer is disposed at a side of the inter-layer insulation layer away from the substrate.

Further, each of the reading transistors includes: a second active layer, disposed on the substrate and arranged on a same layer as the first active layer, wherein the gate insulation layer covers the second active layer; a second gate layer, disposed at a side of the gate insulation layer away from the substrate, and arranged on a same layer as the first gate layer, wherein the inter-layer insulation layer is disposed at a side of the second gate layer away from the substrate, and a plurality of third vias exposing the second active layer are formed in the inter-layer insulation layer and the gate insulation layer; and a second source/drain layer, covering the inter-layer insulation layer, connected with the at least one first interdigital electrode and being in contact with the second active layer through the third vias.

Further, the interdigital electrode layer further includes: a first interdigital connection portion, wherein the plurality of first interdigital electrodes are connected to the first interdigital connection portion which is connected to a corresponding one of the reading transistors.

Further, the interdigital electrode layer further includes: a second interdigital connection portion, wherein the plurality of second interdigital electrodes are connected to the second interdigital connection portion which is connected to the bias signal terminal.

Further, the inter-layer insulation layer includes a first insulation layer and a second insulation layer, and the display panel further includes: a plurality of storage capacitors each including a first electrode layer and a second electrode layer, wherein the first electrode layer is disposed at a side of the gate insulation layer away from the substrate, and arranged on a same layer as the first gate layer; the first insulation layer covers the first gate layer, the first electrode layer, and the gate insulation layer; the second electrode layer is disposed at a side of the first insulation layer away from the substrate and connected with the at least one first interdigital electrode; and the second insulation layer covers the second electrode layer and the first insulation layer.

Further, the inter-layer insulation layer includes a first insulation layer and a second insulation layer, and the display panel further includes: a plurality of storage capacitors each including a first electrode layer and a second electrode layer, wherein the first electrode layer is disposed at a side of the gate insulation layer away from the substrate, and arranged on a same layer as the first gate layer; the first insulation layer covers the first gate layer, the first electrode layer, and the gate insulation layer; the second electrode layer is disposed at a side of the first insulation layer away from the substrate and connected with the at least one first interdigital electrode; and the second insulation layer covers the second electrode layer and the first insulation layer.

According to a first aspect of the present disclosure, there is provided a preparation method of a display panel, including: providing a substrate; forming a plurality of drive transistors, a plurality of reading transistors and a plurality of Schottky photodiodes on the substrate, wherein the drive transistors, the reading transistors and the Schottky photodiodes are formed at a same side of the substrate, each of the Schottky photodiodes includes a photosensitive active layer and an interdigital electrode layer; the interdigital electrode layer is formed on the photosensitive active layer and includes one or more first interdigital electrode and one or more second interdigital electrodes formed at intervals, the one or more first interdigital electrodes are connected to a corresponding reading transistor, and the one or more second interdigital electrodes are connected to a bias signal terminal; forming a plurality of light-emitting units, wherein the light-emitting units are formed at a same side of the substrate as the drive transistors and connected with the drive transistors one-to-one; and disposing a cover plate, wherein the drive transistors, the reading transistors, the Schottky photodiodes and the light-emitting units are located between the substrate and the cover plate.

Further, forming the Schottky photodiodes on the substrate includes: forming the plurality of photosensitive active layers on the substrate, wherein the photosensitive active layers are formed at a same side of the substrate as the drive transistors; forming a plurality of recesses on each of the photosensitive active layers; and forming the plurality of interdigital electrode layers filling the recesses on each of the photosensitive active layers.

Further, a depth of each of the recesses is smaller than or equal to a thickness of each of the photosensitive active layers.

Further, forming the drive transistors and the Schottky photodiodes on the substrate includes: forming a plurality of first active layers and the photosensitive active layers disposed on a same layer on the substrate; forming a gate insulation layer covering the first active layers, the photo-sensitive active layers and the substrate; forming a plurality of first gate layers of the drive transistors at a side of the gate insulation layer away from the first active layers; forming an inter-layer insulation layer covering the first gate layers and the gate insulation layer; forming a plurality of first vias and a plurality of second vias penetrating through the inter-layer insulation layer and the gate insulation layer, wherein the first vias expose the first active layers and the second vias expose the photosensitive active layers; and forming a plurality of first source/drain layers filling the first vias and the interdigital electrode layers filling the second vias, wherein each of the drive transistors includes the first active layer, the gate insulation layer, the first gate layer, the inter-layer insulation layer and the first source/drain layer.

Further, forming the drive transistors, the reading transistors and the Schottky photodiodes on the substrate includes: forming a plurality of first active layers, a plurality of second active layers and the photosensitive active layers disposed on a same layer on the substrate; forming a gate insulation layer covering the first active layers, the second active layers, the photosensitive active layers and the substrate; forming a plurality of first gate layers and a plurality of second gate layers at a side of the gate insulation layer away from the substrate; forming an inter-layer insulation layer covering the first gate layers, the second gate layers and the gate insulation layer; forming a plurality of first vias, a plurality of second vias and a plurality of third vias penetrating through the inter-layer insulation layer and the gate insulation layer, wherein the first vias expose the first active layers, the second vias expose the photosensitive active layers, and the third vias expose the second active layers; and forming a plurality of first source/drain layers filling the first vias, the interdigital electrode layers filling the second vias, and a plurality of second source/drain layers filling the third vias.

Further, the method further includes forming a plurality of storage capacitors on the substrate, wherein forming the drive transistors, the reading transistors, the storage capacitors and the Schottky photodiodes on the substrate includes: forming a plurality of first active layers, a plurality of second active layers and the photosensitive active layers disposed on a same layer on the substrate; forming a gate insulation layer covering the first active layers, the second active layers, the photosensitive active layers and the substrate; forming a plurality of first gate layers, a plurality of second gate layers and a plurality of first electrode layers at a side of the gate insulation layer away from the substrate; forming a plurality of first insulation layers covering the first gate layers, the second gate layers, the first electrode layers and the gate insulation layer; forming a second electrode layer at a side of the first insulation layer away from the substrate; forming a plurality of second insulation layers covering the second electrode layers and the first insulation layer; forming a plurality of first vias, a plurality of second vias and a plurality of third vias penetrating through the first insulation layer, the second insulation layer and the gate insulation layer, wherein the first vias expose the first active layers, the second vias expose the photosensitive active layers, and the third vias expose the second active layers; and forming a plurality of first source/drain layers filling the first vias, the interdigital electrode layers filling the second vias, and a plurality of second source/drain layers filling the third vias.

According to one aspect of the present disclosure, there is provided a display apparatus including the above-mentioned display panel.

DETAILED DESCRIPTION OF THE EMBODIMENTS

Figure 1:
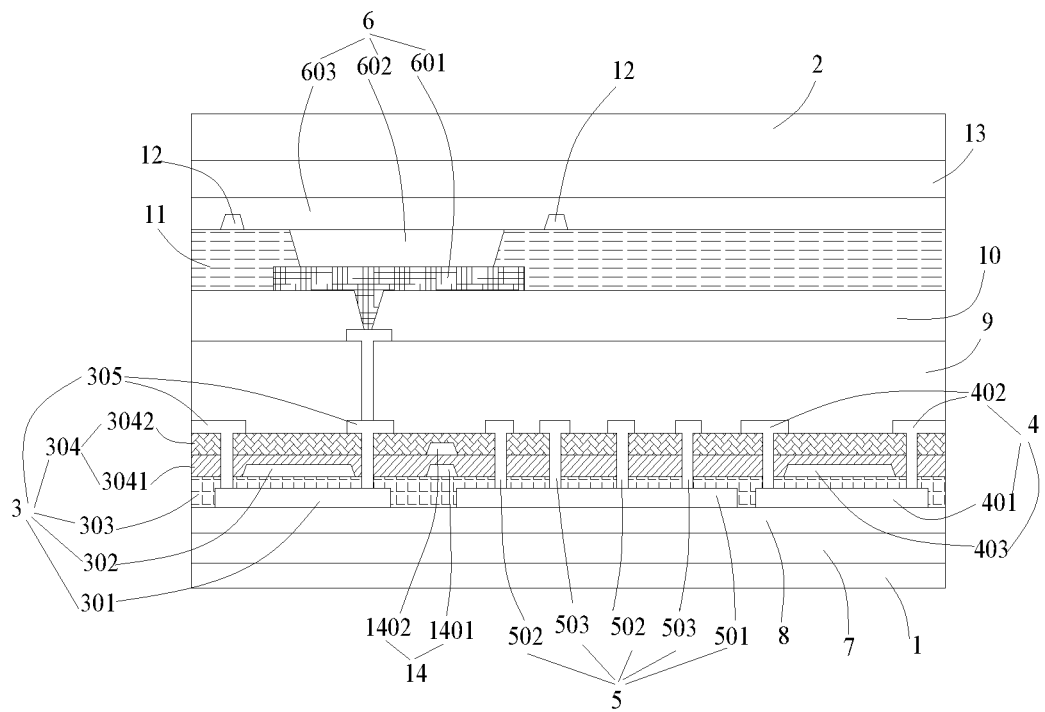
FIG. 1 is a partial sectional view of a display panel according to an example of the present disclosure.

Examples will be described in detail herein, with the illustrations thereof represented in the drawings. When the following descriptions involve the drawings, same numbers in different drawings refer to same or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used herein are only used for the purpose of describing particular examples and not intended to limit the present disclosure. Unless otherwise stated, the technical terms or scientific terms used herein should have general meanings that could be understood by ordinary persons skilled in the art. The words "first", "second" and the like used in the specification and the claims of the present disclosure do not represent any sequence, number or importance but used to distinguish different components. Likewise, the words "one" and "a" and the like also do not represent limitation of number but represent existence of at least one. "Several" or "a plurality" represents two or more. Unless otherwise indicated, the words "front", "rear", "upper" and/or "lower" and the like are used only to facilitate descriptions rather than limited to one position or a spatial orientation. The words "including" or "comprising" and the like are intended to refer to that an element or an article appearing before the "including" or "comprising" covers listed elements or articles and its equivalents appearing after the "including" or "comprising", and does not exclude other elements or articles. The words "connect" or "couple" and the like are not limited to physical or mechanical connection, and may be an electrical connection, whether directly or indirectly. The words "a", "the" and "said" in their singular forms in the present disclosure and the appended claims are also intended to include plurality, unless clearly indicated otherwise in the context. It should also be understood that the term "and/or" as used herein refers to and includes any and all possible combinations of one or more of the associated listed items.

Figure 2:
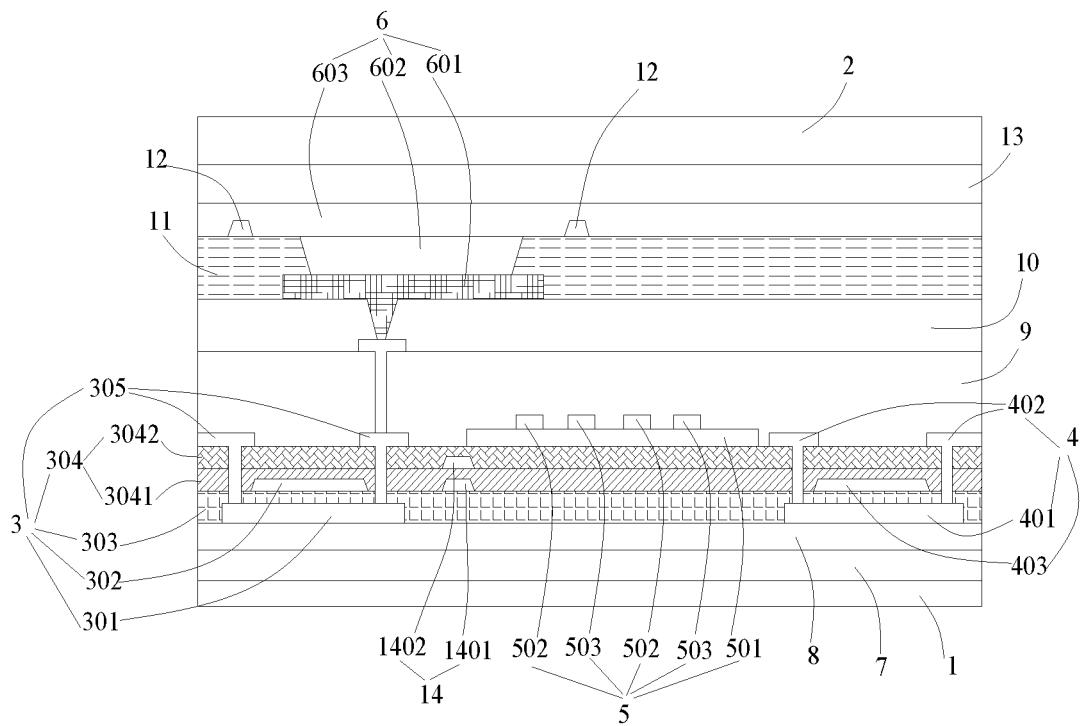
FIG. 2 is a partial sectional view of a display panel according to another example of the present disclosure.

Examples of the present disclosure provide a display panel. As shown in FIGS. 1 and 2, a basic unit of the display panel can include a substrate 1, a drive transistor 3, a reading transistor 4, a Schottky photodiode 5, a light-emitting unit 6 and a cover plate 2.

The substrate 1 and the cover plate 2 are oppositely disposed. The drive transistor 3 is disposed at a side of the substrate 1 facing toward the cover plate 2. The reading transistor 4 is disposed at a side of the substrate 1 facing toward the cover plate 2. The Schottky photodiode 5 is disposed at a side of the substrate 1 facing toward the cover plate 2, and includes a photosensitive active layer 501 and an interdigital electrode layer. The interdigital electrode layer is disposed on the photosensitive active layer 501, and includes one or more first interdigital electrodes 502 and one or more second interdigital electrodes 503 spaced apart (for example, the one or more first interdigital electrodes 502 and the one or more second interdigital electrodes 503 are parallel-disposed and perpendicular to the substrate 1). The one or more first interdigital electrodes 502 are connected to the reading transistor 4, and the one or more second interdigital electrodes 503 are connected to a bias signal terminal. The light-emitting unit 6 is disposed between the substrate 1 and the cover plate 2 and is connected to the drive transistor 3.

During a working process of the display panel in the examples of the present disclosure, the bias signal terminal provides a bias voltage through the one or more second interdigital electrodes 503, the light emitted from the light-emitting unit 6 is reflected by the finger and then received and converted into an electrical signal by the photosensitive active layer 501. The electrical signal is then read by the reading transistor 4 through the one or more first interdigital electrodes 502 to realize fingerprint recognition. Compared with disposal of the fingerprint recognition sensors such as a photodiode at an outer side of the display panel, the Schottky photodiode 5, the reading transistor 4, the drive transistor 3 and the light-emitting unit 6 are all disposed between the substrate 1 and the cover plate 2 in the present disclosure, so that the fingerprint recognition structure (for example, a fingerprint recognition sensor) is integrated into the display panel, thereby realizing in-screen fingerprint recognition.

Different components of the display panel in the examples of the present disclosure will be detailed below.

As shown in FIGS. 1 and 2, the substrate 1 can be a flexible substrate 1. A material of the substrate 1 can be polyimide and the like. In other implementations of the present disclosure, the substrate 1 can be a glass substrate and the like. A barrier layer 7 can be disposed at a side of the substrate 1 facing toward the cover plate 2. A buffer layer 8 can be disposed at a side of the barrier layer 7 away from the substrate 1. The drive transistor 3, the reading transistor 4, the Schottky photodiode 5 and the light-emitting unit 6 as described above are all disposed at a side of the buffer layer 8 away from the substrate 1.

Figure 12:
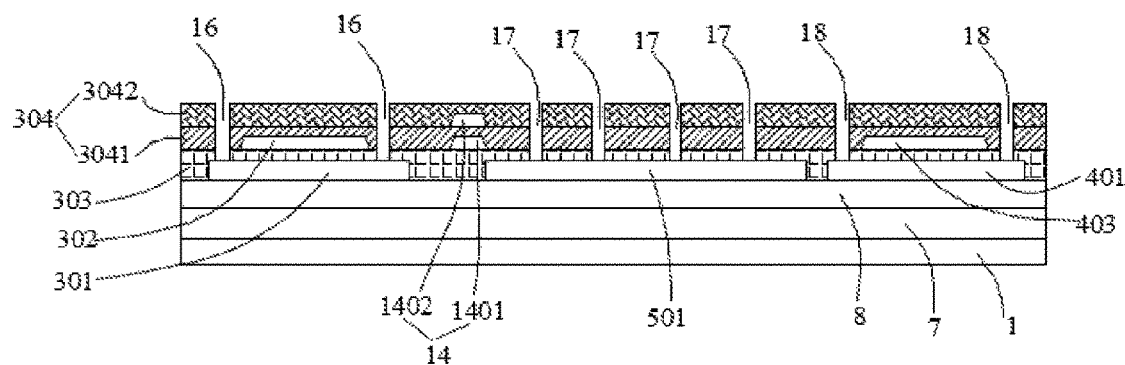
FIG. 12 is yet another schematic diagram of an intermediate structure in a process of preparing a display panel by a preparation method of a display panel according to an example of the present disclosure.

As shown in FIGS. 1 and 2, the drive transistor 3 is disposed at a side of the substrate 1 facing toward the cover plate 2. The drive transistor 3 is connected to the light-emitting unit 6 to drive the light-emitting unit 6 to emit light. The drive transistor 3 can include a first active layer 301, a gate insulation layer 303, a first gate layer 302, an inter-layer insulation layer 304 and a first source/drain layer 305. The first source/drain layer refers to a first source electrode layer and a first drain electrode layer. The first active layer 301 can be disposed at a side of the substrate 1 facing toward the cover plate 2. The gate insulation layer 303 covers the first active layer 301. The first gate layer 302 is disposed at a side of the gate insulation layer 303 away from the substrate 1. The inter-layer insulation layer 304 covers the first gate layer 302 and the gate insulation layer 303, and one or more first vias 16 exposing the first active layer 301 are formed in the inter-layer insulation layer 304 and the gate insulation layer 303 (as shown in FIG. 12), that is, the one or more first vias 16 penetrate through the inter-layer insulation layer 304 and the gate insulation layer 303. The first source/drain layer 305 is covered on the inter-layer insulation layer 304 and is in contact with the first active layer 301 through the one or more first vias 16.

As shown in FIGS. 1 and 2, the reading transistor 4 is disposed at a side of the substrate 1 facing toward the cover plate 2. The reading transistor 4 can include a second active layer 401. The second active layer 401 is disposed at a side of the substrate 1 facing toward the cover plate 2 and arranged on a same layer as the first active layer 301. When the second active layer 401 and the first active layer 301 are of the same material, the second active layer 401 and the first active layer 301 disposed on the same layer can be prepared by one patterning process, thereby simplifying the preparation process flow, saving production costs and improving production efficiency. The above-mentioned gate insulation layer 303 covers the second active layer 401, that is, the drive transistor 3 and the reading transistor 4 share one gate insulation layer 303. The reading transistor 4 further includes a second gate layer 403. The second gate layer 403 is disposed at a side of the gate insulation layer 303 away from the substrate 1 and arranged on a same layer as the first gate layer 302. The above-mentioned inter-layer insulation layer 304 is disposed at a side of the second gate layer 403 away from the substrate 1, that is, the drive transistor 3 and the reading transistor 4 share one inter-layer insulation layer 304. One or more third vias 18 exposing the second active layer 401 are formed in the inter-layer insulation layer 304 and the gate insulation layer 303 (as shown in FIG. 12), that is, the one or more third vias 18 penetrate through the inter-layer insulation layer 304 and the gate insulation layer 303. The reading transistor 4 further includes a second source/drain layer 402. The second source/drain layer refers to a second source electrode layer and a second drain electrode layer. The second source/drain layer 402 covers the inter-layer insulation layer 304 and is in contact with the second active layer 401 through the one or more third vias 18.

As shown in FIGS. 1 and 2, the Schottky photodiode 5 is disposed at a side of the substrate 1 facing toward the cover plate 2 and includes a photosensitive active layer 501 and an interdigital electrode layer. The photosensitive active layer 501 can receive light that is emitted from the light-emitting unit 6 and reflected by the finger, and generate a photocarrier to generate an electrical signal. A material of the photosensitive active layer 501 can be polycrystalline silicon or can be amorphous silicon or can be indium gallium zinc oxide, which is not limited herein. The photosensitive active layer 501 can be a rectangle which is not limited in the examples of the present disclosure.

Figure 3:
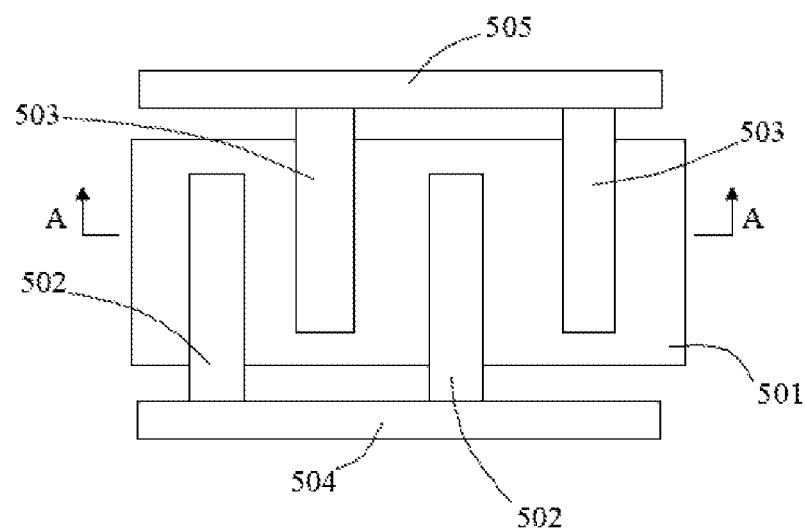
FIG. 3 is a top view of an interdigital electrode layer and a photosensitive active layer in the structure of FIG. 1.

As shown in FIGS. 1, 2 and 3, the interdigital electrode layer is disposed on the photosensitive active layer 501. A material of the interdigital electrode layer can be Indium tin oxide (ITO) and the like. By taking ITO as the material of the interdigital electrode layer as an example, a thickness of the interdigital electrode layer can be 30 nm-100 nm, for example, 30 nm, 50 nm, 80 nm, 85 nm and 100 nm and so on. The interdigital electrode layer includes one or more first interdigital electrodes 502 and one or more second interdigital electrodes 503 spaced apart. The one or more first interdigital electrodes 502 are connected to the reading transistor 4 to read above-mentioned electrical signal generated by the photosensitive active layer 501, and transmit the electrical signal to an image processing system which can generate an image according to the electrical signal. The one or more first interdigital electrodes 502 can be connected to the second source/drain layer 402 of the reading transistor 4. A plurality of first interdigital electrodes 502 can be parallel-disposed at intervals. A width of the first interdigital electrode 502 can be 2 μm-10 μm, for example, 2 μm, 3 μm, 4 μm, 8 μm and 10 μm and so on. The one or more first interdigital electrodes 502 can be elongated electrodes extending along a first direction. Taking the photosensitive active layer 501 being a rectangle as an example, the first direction can be parallel to a side of the photosensitive active layer 501. The interdigital electrode layer can further include a first interdigital connection portion 504. The plurality of first interdigital electrodes 502 are all connected to the first interdigital connection portion 504. The first interdigital connection portion 504 is connected to the second source/drain layer 402 of the reading transistor 4, so that the first interdigital electrodes 502 are connected to the second source/drain layer 402.

As shown in FIGS. 1, 2 and 3, the one or more second interdigital electrodes 503 are connected to a bias signal terminal to provide a bias voltage needed by fingerprint recognition. A plurality of second interdigital electrodes 503 can be parallel-disposed at intervals. A width of the second interdigital electrode 503 can be 2 μm-10 μm, for example, 2 μm, 3 μm, 4 μm, 8 μm and 10 μm and so on. The width of the second interdigital electrode 503 can be identical to the width of the first interdigital electrode 502, which is not limited in the examples of the present disclosure. Any first interdigital electrode 502 is parallel to any second interdigital electrode 503. Taking the one or more first interdigital electrodes 502 being elongated electrodes extending along the first direction as an example, the one or more second interdigital electrodes 503 can also be elongated electrodes extending along the first direction. The interdigital electrode layer can further include a second interdigital connection portion 505. The plurality of second interdigital electrodes 503 are all connected to the second interdigital connection portion 505 which is connected to the above-mentioned bias signal terminal. Further, the first interdigital electrodes 502 and the second interdigital electrodes 503 are alternately arranged. A distance between any adjacent first interdigital electrode 502 and second interdigital electrode 503 can be 2 μm-15 μm, for example, 2 μm, 4 μm, 5 μm, 9 μm and 15 μm and so on. The materials of the second interdigital electrodes 503 and the first interdigital electrodes 502 are same and can be ITO and the like.

Figure 4:
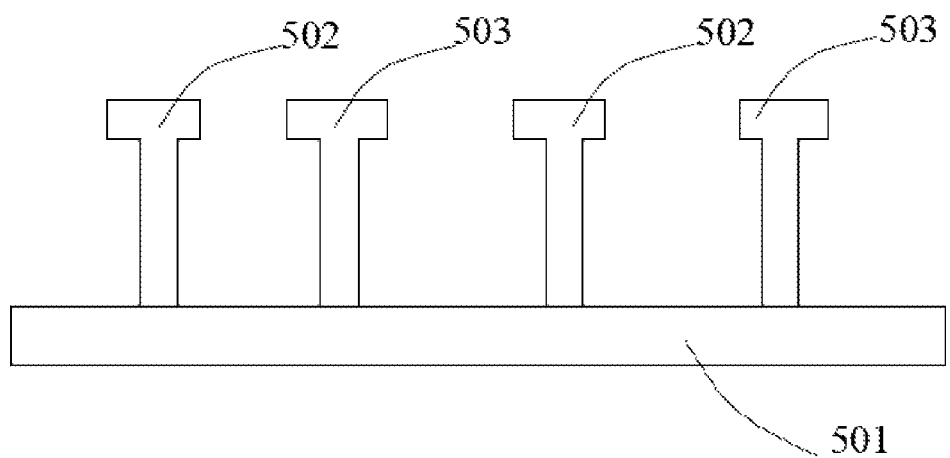
FIG. 4 is a sectional view taken along the A-A line of FIG. 3.
Figure 5:
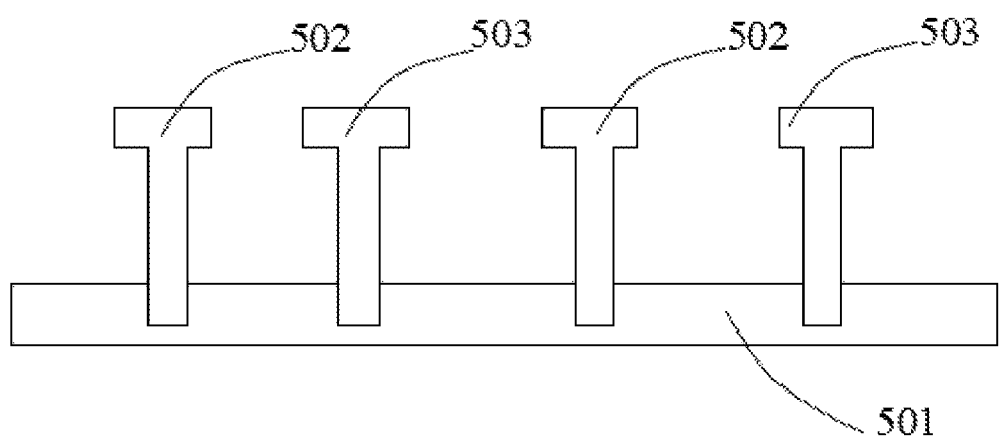
FIG. 5 is another schematic diagram of an interdigital electrode layer and a photosensitive active layer in a display panel according to an example of the present disclosure.
Figure 6:
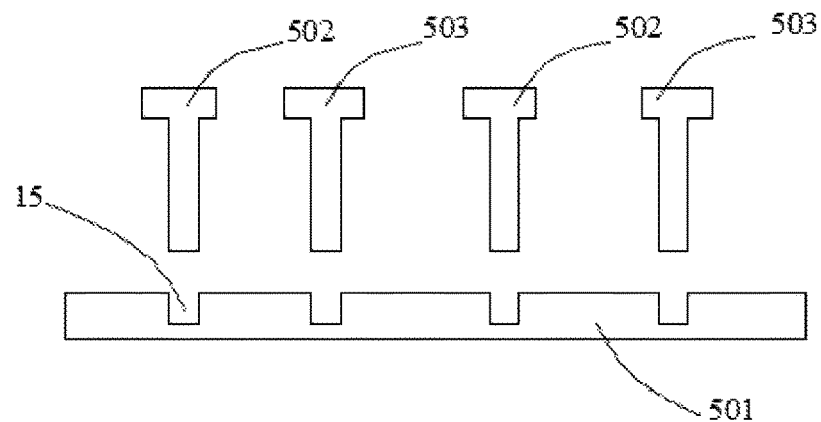
FIG. 6 is an exploded view of the structure of FIG. 5.
Figure 7:
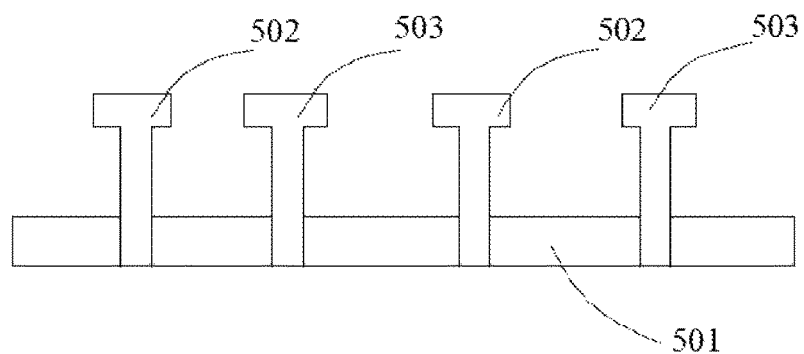
FIG. 7 is still another schematic diagram of an interdigital electrode layer and a photosensitive active layer in a display panel according to an example of the present disclosure.
Figure 8:
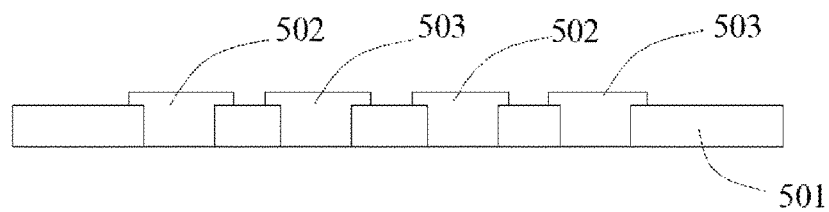
FIG. 8 is a schematic diagram of an interdigital electrode layer and a photosensitive active layer in the structure of FIG. 2.

As shown in FIGS. 5-8, recesses 15 are disposed on a surface of the photosensitive active layer 501 away from the substrate 1. The interdigital electrode layer can fill the recesses 15. A plurality of recesses 15 can be disposed and include a plurality of first recesses and a plurality of second recesses. The above-mentioned plurality of first interdigital electrodes 502 fill the plurality of first recesses one to one, and the above-mentioned plurality of second interdigital electrodes 503 fill the plurality of second recesses one to one. Because the interdigital electrode layer fills the recesses 15, an electric field between the first interdigital electrodes 502 and the second interdigital electrodes 503 is enhanced, so that the photocarrier generated by the photosensitive active layer 501 can be effectively collected, thereby improving photoelectric responsivity of the Schottky photodiode 5. Further, a depth of each of the recesses 15 can be equal to a thickness of the photosensitive active layer 501, that is, the recesses 15 penetrate through the photosensitive active layer 501. In an example, the depth of each of the recesses 15 can be smaller than the thickness of the photosensitive active layer 501. In other implementations of the present disclosure, as shown in FIG. 4, the surface of the photosensitive active layer 501 away from the substrate 1 is a planarization surface.

In an example of the present disclosure, as shown in FIG. 1, the photosensitive active layer 501 is disposed at a side of the substrate 1 facing toward the cover plate 2 and arranged on a same layer as the first active layer 301. The above-mentioned gate insulation layer 303 covers the photosensitive active layer 501. When the photosensitive active layer 501 and the first active layer 301 are of same material, the photosensitive active layer 501 and the first active layer 301 disposed on a same layer can be prepared by one patterning process, thereby simplifying the preparation process flow, saving production costs, and improving production efficiency. The one or more second vias 17 exposing the photosensitive active layer 501 are formed in the gate insulation layer 303 and the above-mentioned inter-layer insulation layer 304 (as shown in FIG. 12), so that the above-mentioned interdigital electrode layer is in contact with the photosensitive active layer 501 through the one or more second vias 17 when covering the inter-layer insulation layer 304. The one or more first vias 16, the one or more second vias 17 and the one or more third vias 18 as described above can be prepared by one patterning process, thereby simplifying the preparation process flow. In another example of the present disclosure, as shown in FIG. 2, the photosensitive active layer 501 is disposed at a side of the above-mentioned inter-layer insulation layer 304 away from the substrate 1, shortening a distance between the photosensitive active layer 501 and the cover plate 2, and further shortening a time in which light reflected by the finger reaches the photosensitive active layer 501, and thus improving the response speed of the fingerprint recognition.

As shown in FIGS. 1 and 2, the light-emitting unit 6 is disposed between the substrate 1 and the cover plate 2 and is connected to the drive transistor 3. The display panel according to the examples of the present disclosure can further include a first planarization layer 9 and a second planarization layer 10. The first planarization layer 9 covers the drive transistor 3, the reading transistor 4 and the Schottky photodiode 5 as described above. The second planarization layer 10 is disposed at a side of the first planarization layer away from the substrate 1. The display panel further includes a pixel definition layer 11 on which a plurality of pixel openings are disposed. One or more support columns 12 can be disposed at a side of the pixel definition layer 11 away from the substrate 1, so as to support a mask plate used in the preparation process of the display panel. The light-emitting unit 6 includes an anode layer 601, an organic electroluminescent layer 602 and a cathode layer 603. The anode layer 601 is disposed in the pixel opening and connected with the first source/drain layer 305 of the drive transistor 3 through a fourth via penetrating through the first planarization layer 9 and the second planarization layer 10. The organic electroluminescent layer 602 is disposed at a side of the anode layer 601 away from the substrate 1. The cathode layer 603 is disposed at a side of the organic electroluminescent layer 602 away from the substrate 1. The display panel can further include an encapsulation layer 13 which is disposed at a side of the cathode layer 603 away from the substrate 1. The above-mentioned cover plate 2 can be disposed at a side of the encapsulation layer 13 away from the substrate 1.

As shown in FIGS. 1 and 2, the display panel according to the examples of the present disclosure can include a plurality of storage capacitors 14. The storage capacitor 14 can be connected to the one or more first interdigital electrodes 502 to store charge of electrical signals generated by the photosensitive active layer 501. The storage capacitor 14 can include a first electrode layer 1401 and a second electrode layer 1402. The second electrode layer 1402 can be connected to the one or more first interdigital electrodes 502. The first electrode layer 1401 is disposed at a side of the above-mentioned gate insulation layer 303 away from the substrate 1 and arranged on a same layer as the first gate layer 302. The above-mentioned inter-layer insulation layer 304 can include a first insulation layer 3041 and a second insulation layer 3042. The first insulation layer 3041 can cover the first gate layer 302, the first electrode layer 1401 and the gate insulation layer 303. The second electrode layer 1402 is disposed at a side of the first insulation layer 3041 away from the substrate 1. The second insulation layer 3042 covers the second electrode layer 1402 and the first insulation layer 3041.

Examples of the present disclosure further provide a preparation method of a display panel for preparing the display panel according to any one of the above-mentioned examples. The preparation method of a display panel can include the following steps S100-S130.

At step S100, a substrate is provided.

At step S110, a plurality of drive transistors, a plurality of reading transistors and a plurality of Schottky photodiodes are formed on the substrate. The drive transistors, the reading transistors and the Schottky photodiodes are formed at a same side of the substrate, and each of the Schottky photodiodes includes a photosensitive active layer and an interdigital electrode layer. The interdigital electrode layer is formed on the photosensitive active layer and includes one or more first interdigital electrodes and one or more second interdigital electrodes formed at intervals. The one or more first interdigital electrodes are connected to a corresponding reading transistor, and the one or more second interdigital electrodes are connected to a bias signal terminal.

At step S120, a plurality of light-emitting units are formed, where the light-emitting units are formed with the drive transistor at a same side of the substrate and connected with the drive transistors one-to-one.

At step S130, a cover plate is disposed, where the drive transistors, the reading transistors, the Schottky photodiodes and the light-emitting units are all located between the substrate and the cover plate.

Since the display panel prepared by the preparation method of a display panel according to the examples of the present disclosure is identical to the above-mentioned display panel, the preparation method of a display panel has the same beneficial effect and will not be repeated herein.

In an example of the present disclosure, forming the plurality of Schottky photodiodes on the substrate can include the steps M1101-M1103.

At step M1101, the plurality of photosensitive active layers are formed on the substrate, where the photosensitive active layers and the drive transistors are formed at a same side of the substrate.

The photosensitive active layers can be prepared by vapor deposition.

At step M1102, a plurality of recesses are formed on each of the photosensitive active layers.

The recesses can be prepared by photoetching process. A depth of the recess can be equal to a thickness of the photosensitive active layer, or can be smaller than the thickness of the photosensitive active layer.

At step M1103, a plurality of interdigital electrode layers filling the recesses on each of the photosensitive active layers are formed, where each of the interdigital electrode layers includes one or more first interdigital electrodes and one or more second interdigital electrodes spaced apart, the one or more first interdigital electrodes are connected to a corresponding reading transistor, and the one or more second interdigital electrodes are connected to a bias signal terminal.

Forming the plurality of interdigital electrode layers filling the recesses on each of the photosensitive active layers can include: forming an interdigital electrode material layer covering the photosensitive active layers, where the interdigital electrode material layer fills the recess; performing patterning on the interdigital electrode material layer to form the plurality of interdigital electrode layers, where each of the interdigital electrode layers includes one or more first interdigital electrodes and one or more second interdigital electrodes spaced apart, the one or more first interdigital electrodes are connected to a corresponding reading transistor, and the one or more second interdigital electrodes are connected to a bias signal terminal.

Each of the drive transistors can include a first active layer, a gate insulation layer, a first gate layer, an inter-layer insulation layer and a first source/drain layer. In an example of the present disclosure, forming the drive transistors and the Schottky photodiodes on the substrate includes: forming a plurality of first active layers and a plurality of photosensitive active layers disposed on a same layer on the substrate; forming the gate insulation layer covering the first active layers, the photosensitive active layers and the substrate; forming a plurality of first gate layers of the drive transistors at a side of the gate insulation layer away from the first active layers; forming the inter-layer insulation layer covering the first gate layers and the gate insulation layer; forming a plurality of first vias and a plurality of second vias penetrating through the inter-layer insulation layer and the gate insulation layer, where the first vias expose the first active layers and the second vias expose the photosensitive active layers; and forming a plurality of first source/drain layers filling the first vias and the interdigital electrode layers filling the second vias.

The preparation method of a display panel according to the examples of the present disclosure further includes: forming the reading transistors on the substrate. Each of the reading transistors can include a second active layer, the gate insulation layer, a second gate layer, the inter-layer insulation layer and a second source/drain layer. The reading transistors and the drive transistors share the gate insulation layer and the inter-layer insulation layer. For example, forming the drive transistors, the reading transistors and Schottky photodiodes on the substrate includes: forming the first active layers, the second active layers and the photosensitive active layers disposed on a same layer on the substrate; forming the gate insulation layer covering the first active layers, the second active layers, the photosensitive active layers and the substrate; forming the first gate layers and the second gate layers at a side of the gate insulation layer away from the substrate; forming the inter-layer insulation layer covering the first gate layers, the second gate layers, the gate insulation layer; forming the first vias, the second vias and a third vias penetrating through the inter-layer insulation layer and the gate insulation layer, where the first vias expose the first active layers, the second vias expose the photosensitive active layers and the third vias expose the second active layers; and forming the first source/drain layers filling the first vias, the interdigital electrode layers filling the second vias, and the second source/drain layers filling the third vias.

The preparation method of a display panel according to the examples of the present disclosure can further include: forming a plurality of storage capacitors on the substrate. Each of the storage capacitor can include a first electrode layer and a second electrode layer. For example, forming the drive transistors, the reading transistors, the storage capacitors and the Schottky photodiodes on the substrate includes the following steps A10 to A17.

Figure 9:
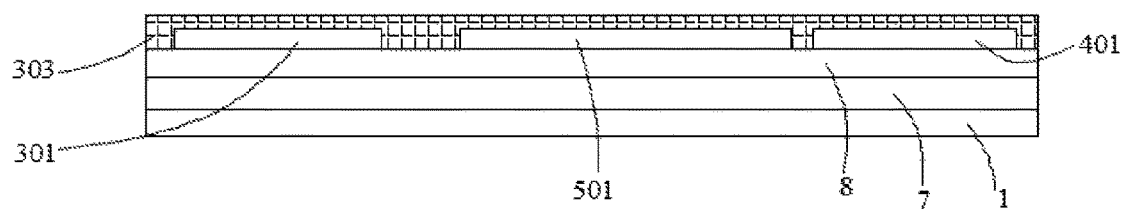
FIG. 9 is a schematic diagram of an intermediate structure in a process of preparing a display panel by a preparation method of a display panel according to an example of the present disclosure.

At step A10, as shown in FIG. 9, the first active layers 301, the second active layers 401, and the photosensitive active layers 501 disposed on a same layer are formed on the substrate 1.

At step A11, as shown in FIG. 9, the gate insulation layer 303 covering the first active layers 301, the second active layers 401, the photosensitive active layers 501 and the substrate 1 is formed.

Figure 10:
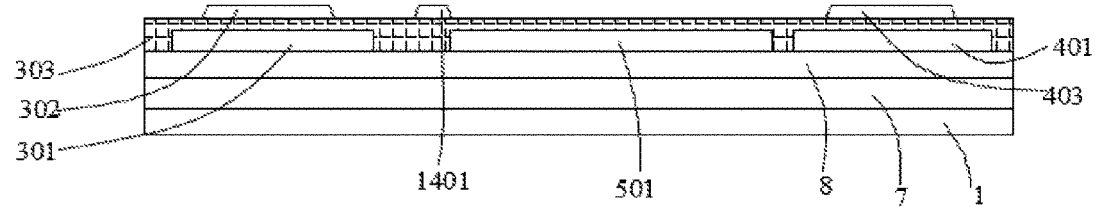
FIG. 10 is another schematic diagram of an intermediate structure in a process of preparing a display panel by a preparation method of a display panel according to an example of the present disclosure.

At step A12, as shown in FIG. 10, the first gate layers 302, the second gate layers 403, and the first electrode layers 1401 are formed at a side of the gate insulation layer 303 away from the substrate 1.

Figure 11:
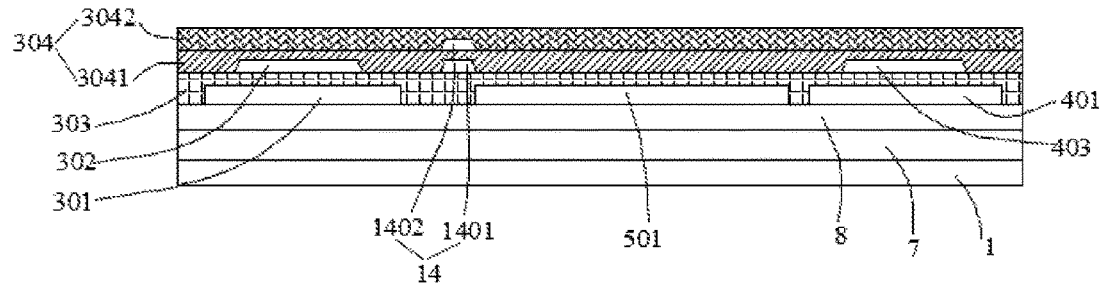
FIG. 11 is still another schematic diagram of an intermediate structure in a process of preparing a display panel by a preparation method of a display panel according to an example of the present disclosure.

At step A13, as shown in FIG. 11, a first insulation layer 3041 covering the first gate layers 302, the second gate layers 403, the first electrode layers 1401 and the gate insulation layer 303 is formed.

At step A14, as shown in FIG. 11, the second electrode layers 1402 are formed at a side of the first insulation layer 3041 away from the substrate 1.

At step A15, as shown in FIG. 11, a second insulation layer 3042 covering the second electrode layers 1402 and the first insulation layer 3041 is formed, where the first insulation layer 3041 and the second insulation layer 3042 form the above-mentioned inter-layer insulation layer 304.

At step A16, as shown in FIG. 12, the first vias 16, the second vias 17 and the third vias 18 penetrating through the inter-layer insulation layer 304 and the gate insulation layer 303 are formed, where the first vias 16 expose the first active layers 301, the second vias 17 expose the photosensitive active layers 501 and the third vias 18 expose the second active layers 401.

Figure 13:
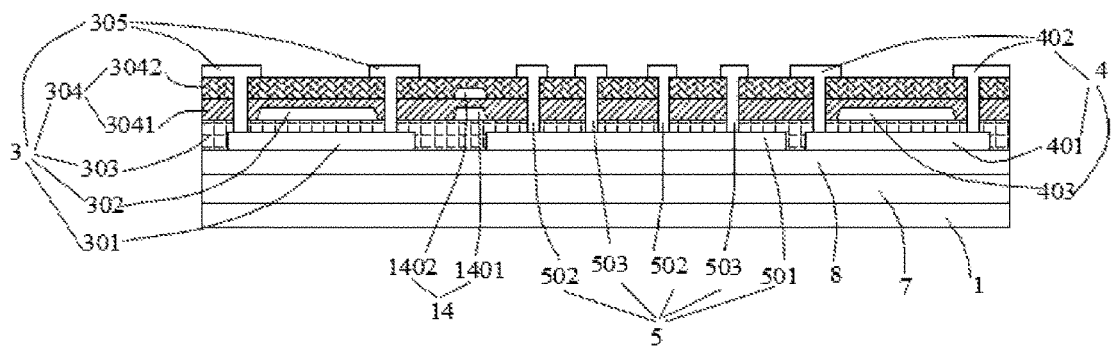
FIG. 13 is still another schematic diagram of an intermediate structure in a process of preparing a display panel by a preparation method of a display panel according to an example of the present disclosure.

At step A17, as shown in FIG. 13, the first source/drain layers 305 filling the first vias 16, the interdigital electrode layers filling the second vias 17 and the second source/drain layers 402 filling the third vias 18 are formed.

An example of the present disclosure further provides a display apparatus. The display apparatus includes the display panel according to any above-mentioned example. The display apparatus can be any product or component having a display function such as a mobile phone, a tablet computer, a TV, a laptop computer, a digital photo frame, a navigator, etc. Since the display panel included in the display apparatus according to the examples of the present disclosure is identical to the above-mentioned display panel, the display panel has the same beneficial effects and will not be repeated herein.

The foregoing descriptions are made to the preferred examples of the present disclosure and will not constitute any limitation to the present disclosure. Although the present disclosure is disclosed with the preferred examples, these preferred examples are not intended to limit the present disclosure. Any simple changes, or modifications or equivalent changes made by those skilled in the art according to the technical contents disclosed above without departing from the scope of the technical solutions of the present disclosure will be regarded as equivalents and will be encompassed in the scope of protection of the present disclosure.

The invention claimed is:

1. A display panel, comprising:
    a substrate and a cover plate, disposed oppositely;
    a plurality of drive transistors, disposed on the substrate and located at a side of the substrate facing toward the cover plate;
    a plurality of reading transistors, disposed on the substrate and located at a side of the substrate facing toward the cover plate;
    a plurality of Schottky photodiodes, disposed on the substrate and located at a side of the substrate facing toward the cover plate and each of the Schottky photodiodes comprising:
        a photosensitive active layer; and
        an interdigital electrode layer, wherein the interdigital electrode layer is disposed on the photosensitive active layer and comprises at least one first interdigital electrode and at least one second interdigital electrode spaced apart, the at least one first interdigital electrode is connected to a corresponding one of the reading transistors, and each of the at least one second interdigital electrode is connected to a bias signal terminal; and
    a plurality of light-emitting units, disposed between the substrate and the cover plate and connected to the drive transistors one-to-one;
    wherein, a plurality of recesses are disposed at a surface of the photosensitive active layer away from the substrate, and the interdigital electrode layer fills the plurality of recesses.

2. The display panel according to claim 1, wherein a depth of each of the plurality of recesses is smaller than or equal to a thickness of the photosensitive active layer.

3. The display panel according to claim 1, wherein, the at least one first interdigital electrode comprises a plurality of first interdigital electrodes which are parallel-disposed at intervals;
    the at least one second interdigital electrode comprises a plurality of second interdigital electrodes which are parallel-disposed at intervals;
    any one of the first interdigital electrodes is parallel to any one of the second interdigital electrodes;
    the first interdigital electrodes and the second interdigital electrodes are alternately arranged, a distance between any adjacent first interdigital electrode and second interdigital electrode is 2 μm-15 μm, and widths of the first interdigital electrodes and the second interdigital electrodes are 2 μm-10 μm.

4. The display panel according to claim 1, wherein each of the drive transistors comprises:
    a first active layer, disposed on the substrate and arranged with the photosensitive active layer on a same layer.

5. The display panel according to claim 4, wherein each of the drive transistors further comprises:
    a gate insulation layer, covering the first active layer and the photosensitive active layer;
    a first gate layer, disposed at a side of the gate insulation layer away from the substrate;
    an inter-layer insulation layer, covering the first gate layer and the gate insulation layer, wherein a plurality of first vias exposing the first active layer and a plurality of second vias exposing the photosensitive active layer are formed in the inter-layer insulation layer and the gate insulation layer; and
    a first source/drain layer, covering the inter-layer insulation layer and being in contact with the first active layer through the first vias;
    wherein the interdigital electrode layer covers the inter-layer insulation layer and is in contact with the photosensitive active layer through the second vias.

6. The display panel according to claim 5, wherein each of the reading transistors comprises:
    a second active layer, disposed on the substrate and arranged on a same layer as the first active layer, wherein the gate insulation layer covers the second active layer;
    a second gate layer, disposed at a side of the gate insulation layer away from the substrate, and arranged on a same layer as the first gate layer, wherein the inter-layer insulation layer is disposed at a side of the second gate layer away from the substrate, and a plurality of third vias exposing the second active layer are formed in the inter-layer insulation layer and the gate insulation layer; and
    a second source/drain layer, covering the inter-layer insulation layer, connected with the at least one first interdigital electrode and being in contact with the second active layer through the third vias.

7. The display panel according to claim 1, wherein each of the drive transistors comprises:
    a first active layer, disposed on the substrate;
    a gate insulation layer, covering the first active layer and the substrate;
    a first gate layer, disposed at a side of the gate insulation layer away from the substrate; and
    an inter-layer insulation layer, covering the first gate layer and the gate insulation layer;
    wherein the photosensitive active layer is disposed at a side of the inter-layer insulation layer away from the substrate.

8. The display panel according to claim 7, wherein each of the reading transistors comprises:
    a second active layer, disposed on the substrate and arranged on a same layer as the first active layer, wherein the gate insulation layer covers the second active layer;
    a second gate layer, disposed at a side of the gate insulation layer away from the substrate, and arranged on a same layer as the first gate layer, wherein the inter-layer insulation layer is disposed at a side of the second gate layer away from the substrate, and a plurality of third vias exposing the second active layer are formed in the inter-layer insulation layer and the gate insulation layer; and a second source/drain layer, covering the inter-layer insulation layer, connected with the at least one first interdigital electrode and being in contact with the second active layer through the third vias.

9. The display panel according to claim 3, wherein the interdigital electrode layer further comprises:
a first interdigital connection portion, wherein the plurality of first interdigital electrodes are connected to the first interdigital connection portion which is connected to a corresponding one of the reading transistors.

10. The display panel according to claim 9, wherein the interdigital electrode layer further comprises:
a second interdigital connection portion, wherein the plurality of second interdigital electrodes are connected to the second interdigital connection portion which is connected to the bias signal terminal.

11. The display panel according to claim 5, wherein the inter-layer insulation layer comprises a first insulation layer and a second insulation layer, and the display panel further comprises:
a plurality of storage capacitors each comprising a first electrode layer and a second electrode layer, wherein the first electrode layer is disposed at a side of the gate insulation layer away from the substrate, and arranged on a same layer as the first gate layer; the first insulation layer covers the first gate layer, the first electrode layer, and the gate insulation layer; the second electrode layer is disposed at a side of the first insulation layer away from the substrate and connected with the at least one first interdigital electrode; and the second insulation layer covers the second electrode layer and the first insulation layer.

12. The display panel according to claim 7, wherein the inter-layer insulation layer comprises a first insulation layer and a second insulation layer, and the display panel further comprises:
a plurality of storage capacitors each comprising a first electrode layer and a second electrode layer, wherein the first electrode layer is disposed at a side of the gate insulation layer away from the substrate, and arranged on a same layer as the first gate layer; the first insulation layer covers the first gate layer, the first electrode layer, and the gate insulation layer; the second electrode layer is disposed at a side of the first insulation layer away from the substrate and connected with the at least one first interdigital electrode; and the second insulation layer covers the second electrode layer and the first insulation layer.

13. A preparation method of a display panel, comprising:
providing a substrate;
forming a plurality of drive transistors, a plurality of reading transistors and a plurality of Schottky photodiodes on the substrate, wherein the drive transistors, the reading transistors and the Schottky photodiodes are formed at a same side of the substrate, each of the Schottky photodiodes comprises a photosensitive active layer and an interdigital electrode layer; the interdigital electrode layer is formed on the photosensitive active layer and comprises one or more first interdigital electrodes and one or more second interdigital electrodes formed at intervals, the one or more first interdigital electrodes are connected to one corresponding reading transistor, and the one or more second interdigital electrodes are connected to a bias signal terminal;
forming a plurality of light-emitting units, wherein the light-emitting units are formed at a same side of the substrate as the drive transistors and connected with the drive transistors one-to-one; and
disposing a cover plate, wherein the drive transistors, the reading transistors, the Schottky photodiodes and the light-emitting units are located between the substrate and the cover plate;
wherein forming the Schottky photodiodes on the substrate comprises:
forming the plurality of photosensitive active layers on the substrate, wherein the photosensitive active layers are formed at a same side of the substrate as the drive transistors;
forming a plurality of recesses on each of the photosensitive active layers; and
forming the plurality of interdigital electrode layers filling the recesses on each of the photosensitive active layers.

14. The preparation method of the display panel according to claim 13, wherein a depth of each of the recesses is smaller than or equal to a thickness of each of the photosensitive active layers.

15. The preparation method of the display panel according to claim 13, wherein forming the drive transistors and the Schottky photodiodes on the substrate comprises:
forming a plurality of first active layers and the photosensitive active layers disposed on a same layer on the substrate;
forming a gate insulation layer covering the first active layers, the photosensitive active layers and the substrate;
forming a plurality of first gate layers of the drive transistors at a side of the gate insulation layer away from the first active layers;
forming an inter-layer insulation layer covering the first gate layers and the gate insulation layer;
forming a plurality of first vias and a plurality of second vias penetrating through the inter-layer insulation layer and the gate insulation layer, wherein the first vias expose the first active layers and the second vias expose the photosensitive active layers; and
forming a plurality of first source/drain layers filling the first vias and the interdigital electrode layers filling the second vias, wherein each of the drive transistors comprises the first active layer, the gate insulation layer, the first gate layer, the inter-layer insulation layer and the first source/drain layer.

16. The preparation method of the display panel according to claim 13, wherein forming the drive transistors, the reading transistors and the Schottky photodiodes on the substrate comprises:
forming a plurality of first active layers, a plurality of second active layers and the photosensitive active layers disposed on a same layer on the substrate;
forming a gate insulation layer covering the first active layers, the second active layers, the photosensitive active layers and the substrate;
forming a plurality of first gate layers and a plurality of second gate layers at a side of the gate insulation layer away from the substrate;
forming an inter-layer insulation layer covering the first gate layers, the second gate layers and the gate insulation layer;
forming a plurality of first vias, a plurality of second vias and a plurality of third vias penetrating through the inter-layer insulation layer and the gate insulation layer, wherein the first vias expose the first active layers, the second vias expose the photosensitive active layers, and the third vias expose the second active layers; and forming a plurality of first source/drain layers filling the first vias, the interdigital electrode layers filling the second vias, and a plurality of second source/drain layers filling the third vias.

17. The preparation method of the display panel according to claim 13, further comprising forming a plurality of storage capacitors on the substrate, wherein forming the drive transistors, the reading transistors, the storage capacitors and the Schottky photodiodes on the substrate comprises:

forming a plurality of first active layers, a plurality of second active layers and the photosensitive active layers disposed on a same layer on the substrate;

forming a gate insulation layer covering the first active layers, the second active layers, the photosensitive active layers and the substrate;

forming a plurality of first gate layers, a plurality of second gate layers and a plurality of first electrode layers at a side of the gate insulation layer away from the substrate;

forming a first insulation layer covering the first gate layers, the second gate layers, the first electrode layers and the gate insulation layer;

forming a second electrode layer at a side of the first insulation layer away from the substrate;

forming a second insulation layer covering the second electrode layers and the first insulation layer;

forming a plurality of first vias, a plurality of second vias and a plurality of third vias penetrating through the first insulation layer, the second insulation layer and the gate insulation layer, wherein the first vias expose the first active layers, the second vias expose the photosensitive active layers, and the third vias expose the second active layers; and forming a plurality of first source/drain layers filling the first vias, the interdigital electrode layers filling the second vias, and a plurality of second source/drain layers filling the third vias.

18. A display apparatus, comprising the display panel according to claim 1.

19. A display panel, comprising:

a substrate and a cover plate, disposed oppositely;

a plurality of drive transistors, disposed on the substrate and located at a side of the substrate facing toward the cover plate;

a plurality of reading transistors, disposed on the substrate and located at a side of the substrate facing toward the cover plate;

a plurality of Schottky photodiodes, disposed on the substrate and located at a side of the substrate facing toward the cover plate and each of the Schottky photodiodes comprising:

a photosensitive active layer; and an interdigital electrode layer, wherein the interdigital electrode layer is disposed on the photosensitive active layer and comprises at least one first interdigital electrode and at least one second interdigital electrode spaced apart, the at least one first interdigital electrode is connected to a corresponding one of the reading transistors, and each of the at least one second interdigital electrode is connected to a bias signal terminal; and a plurality of light-emitting units, disposed between the substrate and the cover plate and connected to the drive transistors one-to-one;

wherein each of the drive transistors comprises: a first active layer, disposed on the substrate and arranged with the photosensitive active layer on a same layer.

* * * * *